(12) United States Patent
Chiang et al.

(10) Patent No.: US 9,385,145 B2
(45) Date of Patent: Jul. 5, 2016

(54) DOUBLE THIN FILM TRANSISTOR STRUCTURE WITH SHARED GATE

(71) Applicant: CHUNGHWA PICTURE TUBES, LTD., Taoyuan County (TW)

(72) Inventors: Shin-Chuan Chiang, Taipei (TW); Ya-Ju Lu, New Taipei (TW); Yu-Hsien Chen, Hsinchu County (TW); Yen-Yu Huang, Bade (TW)

(73) Assignee: CHUNGHWA PICTURE TUBES, LTD., Bade, Taoyuan (TW)

( * ) Notice: Subject to any disclaimer, the term of this patent is extended or adjusted under 35 U.S.C. 154(b) by 0 days.

(21) Appl. No.: 14/554,104

(22) Filed: Nov. 26, 2014

(65) Prior Publication Data
US 2016/0079285 A1    Mar. 17, 2016

(30) Foreign Application Priority Data

Sep. 12, 2014  (TW) .............................. 103131601 A

(51) Int. Cl.
*H01L 27/12* (2006.01)
(52) U.S. Cl.
CPC .......... *H01L 27/1251* (2013.01); *H01L 27/127* (2013.01); *H01L 27/1222* (2013.01)
(58) Field of Classification Search
None
See application file for complete search history.

(56) References Cited

U.S. PATENT DOCUMENTS

| | | | | |
|---|---|---|---|---|
| 8,895,692 B2* | 11/2014 | Miura | .................. | C07D 495/04 257/40 |
| 2006/0267100 A1* | 11/2006 | Noguchi | ................. | H01L 21/84 257/351 |
| 2010/0176395 A1* | 7/2010 | Choi | ....................... | H01L 27/12 257/43 |
| 2011/0079784 A1* | 4/2011 | Im | ....................... | H01L 27/3262 257/59 |
| 2014/0252326 A1* | 9/2014 | Koo | ..................... | H01L 27/3262 257/40 |
| 2014/0284593 A1* | 9/2014 | Nakano | ............. | H01L 29/66969 257/43 |

\* cited by examiner

*Primary Examiner* — Marc Armand
*Assistant Examiner* — Younes Boulghassoul
(74) *Attorney, Agent, or Firm* — McClure, Qualey & Rodack, LLP

(57) ABSTRACT

A double thin film transistor includes a first semiconductor layer, a gate, a second semiconductor layer, a first insulating layer, a second insulating layer, a first source, a first drain, a second source and a second drain. The first semiconductor layer is disposed over a substrate. The gate is disposed over the first semiconductor layer. The second semiconductor layer is disposed over the gate, and the first and second semiconductor layers are the same conductive type. The first insulating layer is disposed between the first semiconductor layer and the gate. The second insulating layer is disposed between the gate and the second semiconductor layer. The first source and the first drain are disposed between the substrate and the second insulating layer. The second source and the second drain are disposed over the second insulating layer.

4 Claims, 5 Drawing Sheets

DOUBLE THIN FILM TRANSISTOR STRUCTURE WITH SHARED GATE

RELATED APPLICATIONS

This application claims priority to Taiwanese Application Serial Number 103131601, filed Sep. 12, 2014, which is herein incorporated by reference.

BACKGROUND

1. Field of Invention

The present invention relates to a double thin film transistor and a method of manufacturing the double thin film transistor.

2. Description of Related Art

A liquid crystal display includes a thin film transistor substrate, a color filter substrate and a liquid crystal molecule layer disposed therebetween. The thin film transistor substrate includes a plurality of thin film transistors, and each of the thin film transistors includes a gate, a gate insulating layer, a semiconductor layer, a source and a drain. The semiconductor layer may be made of a material including amorphous silicon, polycrystalline silicon, microcrystalline silicon, monocrystalline silicon, organic semiconductors, oxide semiconductors or other suitable materials.

However, current circuit design becomes more and more complicated, and thus a plurality of thin film transistors are disposed in single sub-pixel region, resulting in greater area of the sub-pixel region for accommodating the thin film transistors, which is not conducive to the size of the thin film transistor substrate. Therefore, how to prevent great area of the sub-pixel region due to more thin film transistors becomes one of problems faced in the art.

SUMMARY

The present invention provides a double thin film transistor including two thin film transistors stacked along a thickness direction and sharing a same gate. The double thin film transistor may be applied in circuit design including a plurality of thin film transistors to decrease occupied area on the substrate, and thus to solve the problem mentioned in the related art.

The present invention provides a double thin film transistor includes a first semiconductor layer, a gate, a second semiconductor layer, a first insulating layer, a second insulating layer, a first source, a first drain, a second source and a second drain. The first semiconductor layer is disposed over a substrate. The gate is disposed over the first semiconductor layer. The second semiconductor layer is disposed over the gate, in which the first and second semiconductor layers are the same conductive type. The first insulating layer is disposed between the first semiconductor layer and the gate. The second insulating layer is disposed between the gate and the second semiconductor layer. The first source and the first drain are disposed between the substrate and the second insulating layer, and the first semiconductor layer is in contact with a portion of the first source and a portion of the first drain. The second source and the second drain are disposed over the second insulating layer, and the second semiconductor layer is in contact with a portion of the second source and a portion of the second drain.

According to one embodiment of the present invention, the first insulating layer has a first opening and a second opening separated from each other, and the first semiconductor layer is in contact with the portion of the first source and the portion of the first drain respectively through the first opening and the second opening.

According to one embodiment of the present invention, the double thin film transistor further includes a third insulating layer disposed over the second semiconductor layer, and the third insulating layer has a third opening and a fourth opening separated from each other, and the second semiconductor layer is in contact with the portion of the second source and the portion of the second drain respectively through the third opening and the fourth opening.

According to one embodiment of the present invention, the second semiconductor layer is disposed over the second source and directly in contact with the portion of the second source.

According to one embodiment of the present invention, the double thin film transistor further includes a third insulating layer disposed over the second semiconductor layer, and the third insulating layer has a fourth opening, and the second semiconductor layer is in contact with the portion of the second drain through the fourth opening.

The present invention also provides a method of manufacturing a double thin film transistor including forming a first semiconductor layer over a substrate; forming a first insulating layer over the first semiconductor layer; forming a first source over the substrate, and the first semiconductor layer in contact with a portion of the first source; forming a first drain over the substrate, and the first semiconductor layer in contact with a portion of the first drain; forming a gate over the first insulating layer; forming a second insulating layer over the gate; forming a second semiconductor layer over the second insulating layer; forming a second source over the second insulating layer, and the second semiconductor layer in contact with a portion of the second source; and forming a second drain over the second insulating layer, and the second semiconductor layer in contact with a portion of the second drain.

According to one embodiment of the present invention, the method further includes forming a third insulating layer over the second semiconductor layer after forming the second semiconductor layer, and the third insulating layer has a third opening and a fourth opening separated from each other, and forming the second source includes forming the second source over the third insulating layer and in the third opening to let the second semiconductor layer in contact with the portion of the second source through the third opening, and forming the second drain includes forming the second drain over the third insulating layer and in the fourth opening to let the second semiconductor layer in contact with the portion of the second drain through the fourth opening.

According to one embodiment of the present invention, forming the second source is before forming the second semiconductor layer.

According to one embodiment of the present invention, the method further includes forming a third insulating layer over the second semiconductor layer after forming the second semiconductor layer and before forming the second drain, and the third insulating layer has a fourth opening, and forming the second drain includes forming the second drain over the third insulating layer and in the fourth opening to let the second semiconductor layer in contact with the portion of the second drain through the fourth opening.

According to one embodiment of the present invention, forming the gate, forming the first source and forming the first drain are conducted by a same photolithography and etching process.

BRIEF DESCRIPTION OF THE DRAWINGS

The invention can be more fully understood by reading the following detailed description of the embodiment, with reference made to the accompanying drawings as follows.

DETAILED DESCRIPTION

As related art mentioned, there are a plurality of thin film transistors disposed in single sub-pixel region, resulting in greater area of the sub-pixel region for accommodating the thin film transistors, which is not conducive to the size of the thin film transistor substrate. Therefore, the present invention provides a double thin film transistor including two thin film transistors stacked along a thickness direction (or called as a direction perpendicular to the plane) and sharing a same gate. The double thin film transistor may be applied in circuit design including a plurality of thin film transistors to decrease occupied area on the substrate. For instance, scan driver circuit may be directly formed over the thin film transistor substrate, which may be called as Gate Driver In Panel (GIP). GIP circuit design may be include a plurality of the thin film transistors. The double thin film transistor of the present invention may be applied in the GIP circuit design to significantly decrease a width of a border of the thin film transistor substrate and thus to meet a requirement of narrow border. In practical applications, the GIP circuit design may further include a capacitor. The person skilled in the art may make an appropriate layout and structural design for the thin film transistors and the capacitor in accordance with actual demand.

Figure 1:
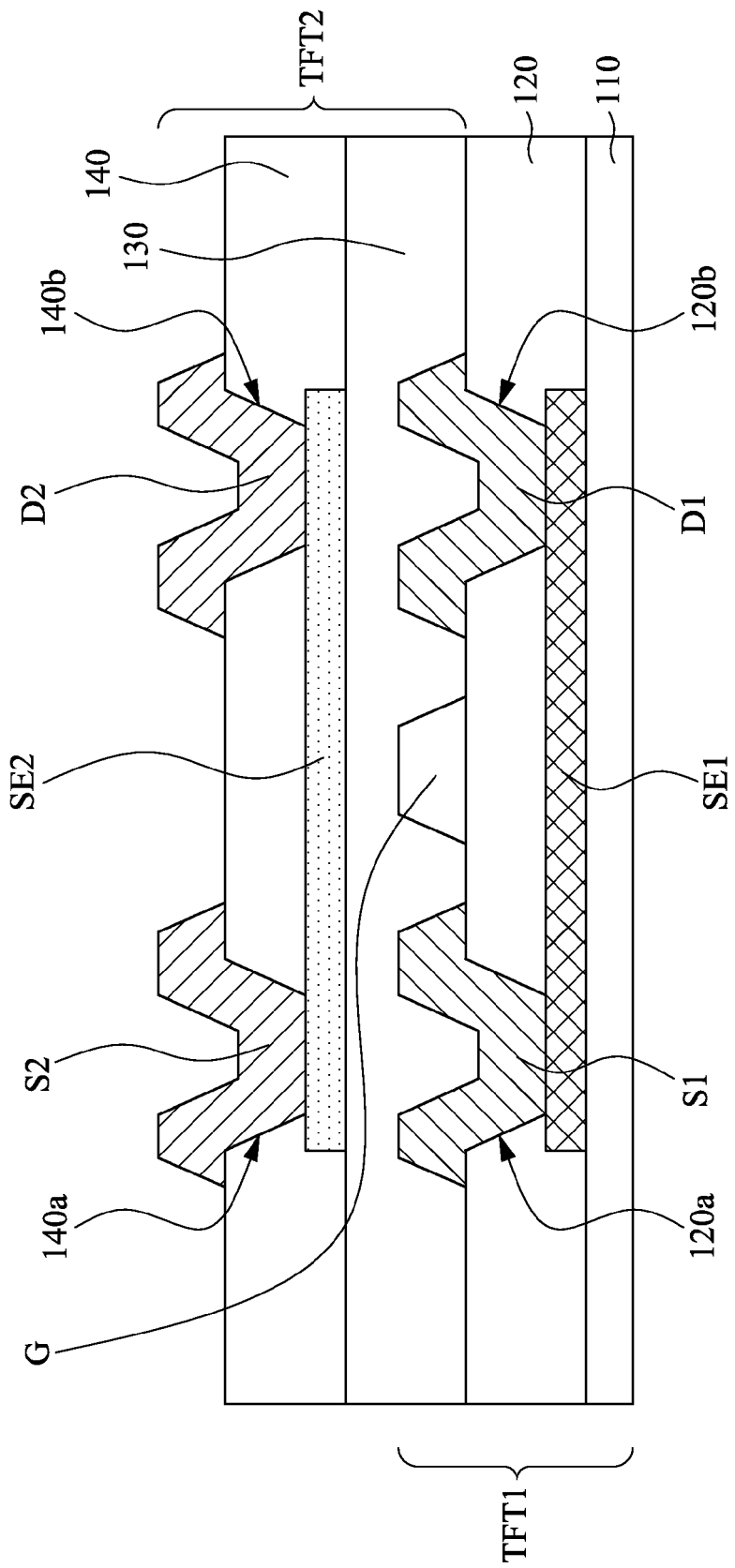
FIG. 1 is a cross-sectional view of a double thin film transistor according to one embodiment of the present invention.

FIG. 1 is a cross-sectional view of a double thin film transistor according to one embodiment of the present invention. The double thin film transistor includes a first semiconductor layer SE1, a gate G, a second semiconductor layer SE2, a first insulating layer 120, a second insulating layer 130, a first source S1, a first drain D1, a second source S2 and a second drain D2. In other words, the double thin film transistor includes a first thin film transistor TFT1 and a second thin film transistor TFT2 sharing the same gate G.

It should be noted that, as shown in FIG. 1, the relative positional relationship of the first source S1, the first drain D1 and the first semiconductor layer SE1 and that of the second source S2, the second drain D2 and the second semiconductor layer SE2 are one of the embodiments. The person skilled in the art should understand that the relative positional relationship of the first source S1, the first drain D1 and the first semiconductor layer SE1 and that of the second source S2, the second drain D2 and the second semiconductor layer SE2 may be appropriately adjusted. Therefore, the double thin film transistor of the present invention is not limited to the exemplified embodiments in the detailed description of the present invention.

In addition, in accordance with circuit design requirements, the elements of the double thin film transistor may be electrically connected to other elements, such as data lines and pixel electrodes. In one embodiment, the first source S1 and the second source S2 may be electrically connected to a data line (not shown). The first drain D1 and the second drain D2 may be electrically connected to two pixel electrodes (not shown) respectively, but not limited thereto.

The first semiconductor layer SE1 is disposed over a substrate 110. The substrate 110 should have enough mechanical strength, such as glass, quartz, a transparent polymer material or other suitable materials. The first semiconductor layer SE1 may be a single layer or a multilayer structure. The first semiconductor layer SE1 may include amorphous silicon, polycrystalline silicon, microcrystalline silicon, monocrystalline silicon, an organic semiconductor, a metal oxide semiconductor or other suitable materials. In one embodiment, the first semiconductor layer SE1 includes a metal oxide semiconductor, such as zinc oxide (ZnO), zinc tin oxide (ZnSnO), gallium tin oxide (GaSnO), indium gallium zinc oxide (InGaZnO), indium zinc oxide (InZnO), other suitable materials or a combination thereof.

The gate G is disposed over the first semiconductor layer SE1. The gate G may be metal or metal compound. The metal may include molybdenum (Mo), chromium (Cr), aluminum (Al), neodymium (Nd), titanium (Ti), copper (Cu), silver (Ag), gold (Au), zinc (Zn), indium (In), gallium (Ga), other suitable materials or a combination thereof. The metal compound may include metal alloy, metal oxide, metal nitride, metal oxynitride, other suitable materials or a combination thereof.

The second semiconductor layer SE2 is disposed over the gate G. The second semiconductor layer SE2 may be a single layer or a multilayer structure. Embodiments of the material of the second semiconductor layer SE2 may be referred to those of the first semiconductor layer SE1. It is noteworthy that the first and second semiconductor layers SE1, SE2 are the same conductive type. Therefore, a voltage applied by the gate G may simultaneously drive the first thin film transistor TFT1 and the second thin film transistor TFT2. In one embodiment, the first and second semiconductor layers SE1, SE2 are n-type; for example, the first and second semiconductor layers SE1, SE2 include a metal oxide semiconductor. In one embodiment, the first and second semiconductor layers SE1, SE2 are p-type; for example, the first and second semiconductor layers SE1, SE2 include polycrystalline silicon.

The first insulating layer 120 is disposed between the first semiconductor layer SE1 and the gate G. The first insulating layer 120 is configured to be a gate insulating layer of the first thin film transistor TFT1. The first insulating layer 120 may be a single layer or a multilayer structure and made of a material including organic dielectric materials, inorganic dielectric materials or a combination thereof. The organic dielectric materials may be polyimide (PI), other suitable materials or a combination thereof. The inorganic dielectric materials may be silicon oxide, silicon nitride, silicon oxynitride, other suitable materials or a combination thereof.

The second insulating layer 130 is disposed between the gate G and the second semiconductor layer SE2. The second insulating layer 130 is configured to be a gate insulating layer of the second thin film transistor TFT2. Embodiments of the material of the second insulating layer 130 may be referred to those of the first insulating layer 120.

The first source S1 and the first drain D1 are disposed between the substrate 110 and the second insulating layer 130, and the first semiconductor layer SE1 is in contact with a portion of the first source S1 and a portion of the first drain D1. In the embodiment, the first insulating layer 120 has a first opening 120a and a second opening 120b separated from each other, and the first source S1 and the first drain D1 are respectively disposed in the first opening 120a and the second opening 120b so as to let the first semiconductor layer SE1 in contact with the portion of the first source S1 and the portion of the first drain D1 respectively through the first opening 120a and the second opening 120b.

The second source S2 and the second drain D2 are disposed over the second insulating layer 130, and the second semiconductor layer SE2 is in contact with a portion of the second source S2 and a portion of the second drain D2. In the embodiment, the double thin film transistor further includes a third insulating layer 140 disposed over the second semiconductor layer SE2, and the third insulating layer 140 has a third opening 140a and a fourth opening 140b separated from each other. The second source S2 and the second drain D2 are respectively disposed in the third opening 140a and the fourth opening 140b to let second semiconductor layer SE2 in contact with the portion of the second source S2 and the portion of the second drain D2 respectively through the third opening 140a and the fourth opening 140b.

Figure 2:
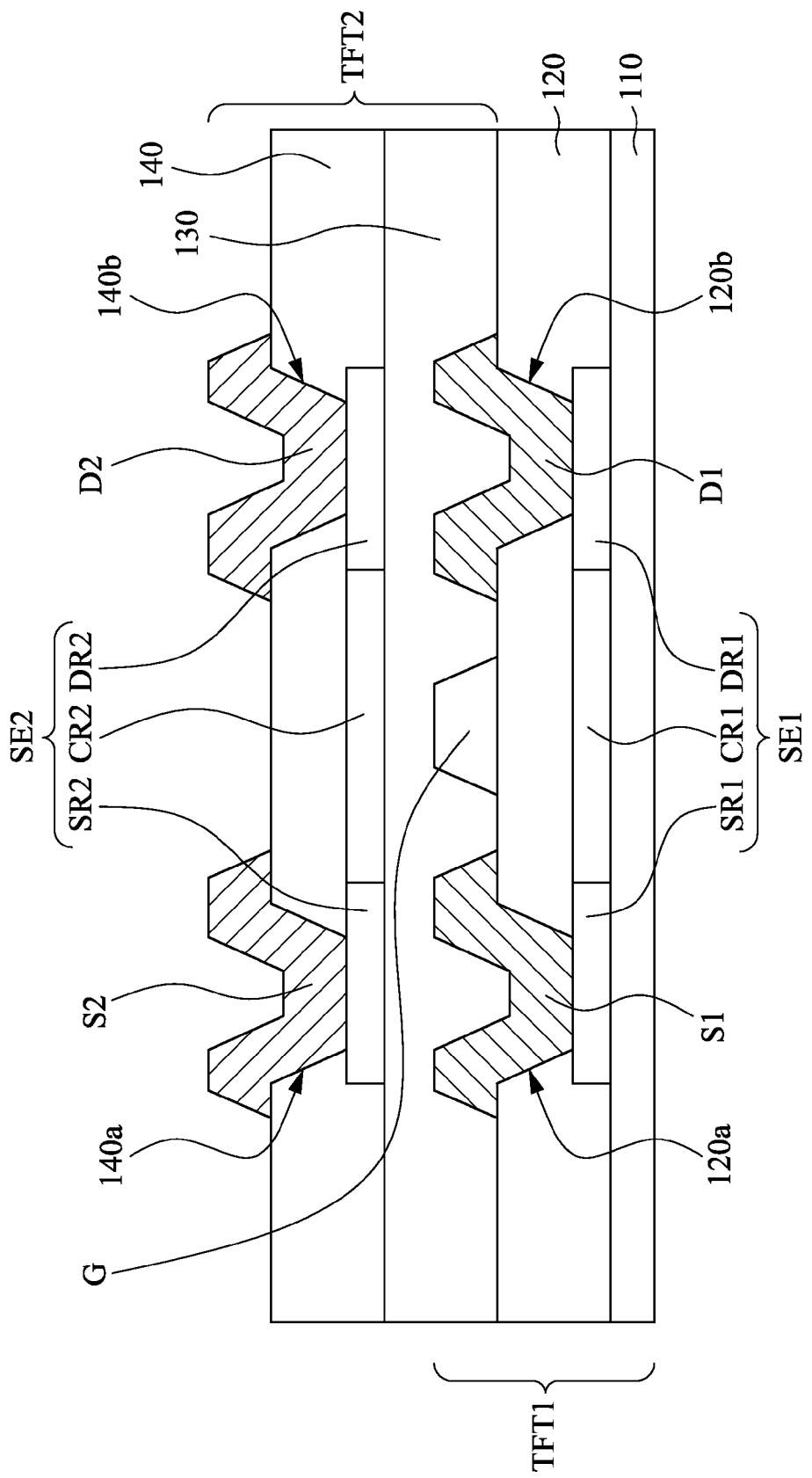
FIG. 2 is a cross-sectional view of a double thin film transistor according to another embodiment of the present invention.

FIG. 2 is a cross-sectional view of a double thin film transistor according to another embodiment of the present invention. The difference between the embodiments of FIG. 2 and FIG. 1 is that the first semiconductor layer SE1 and the second semiconductor layer SE2 of FIG. 2 include amorphous silicon. The first semiconductor layer SE1 includes a first source region SR1, a first channel region CR1 and a first drain region DR1. The second semiconductor layer SE2 includes a second source region SR2, a second channel region CR2 and a second drain region DR2. In one embodiment, n-type dopants are doped into amorphous silicon to form the n-type first source region SR1, first drain region DR1, second source region SR2 and second drain region DR2. The first channel region CR1 and the second channel region CR2 are not doped.

Figure 3:
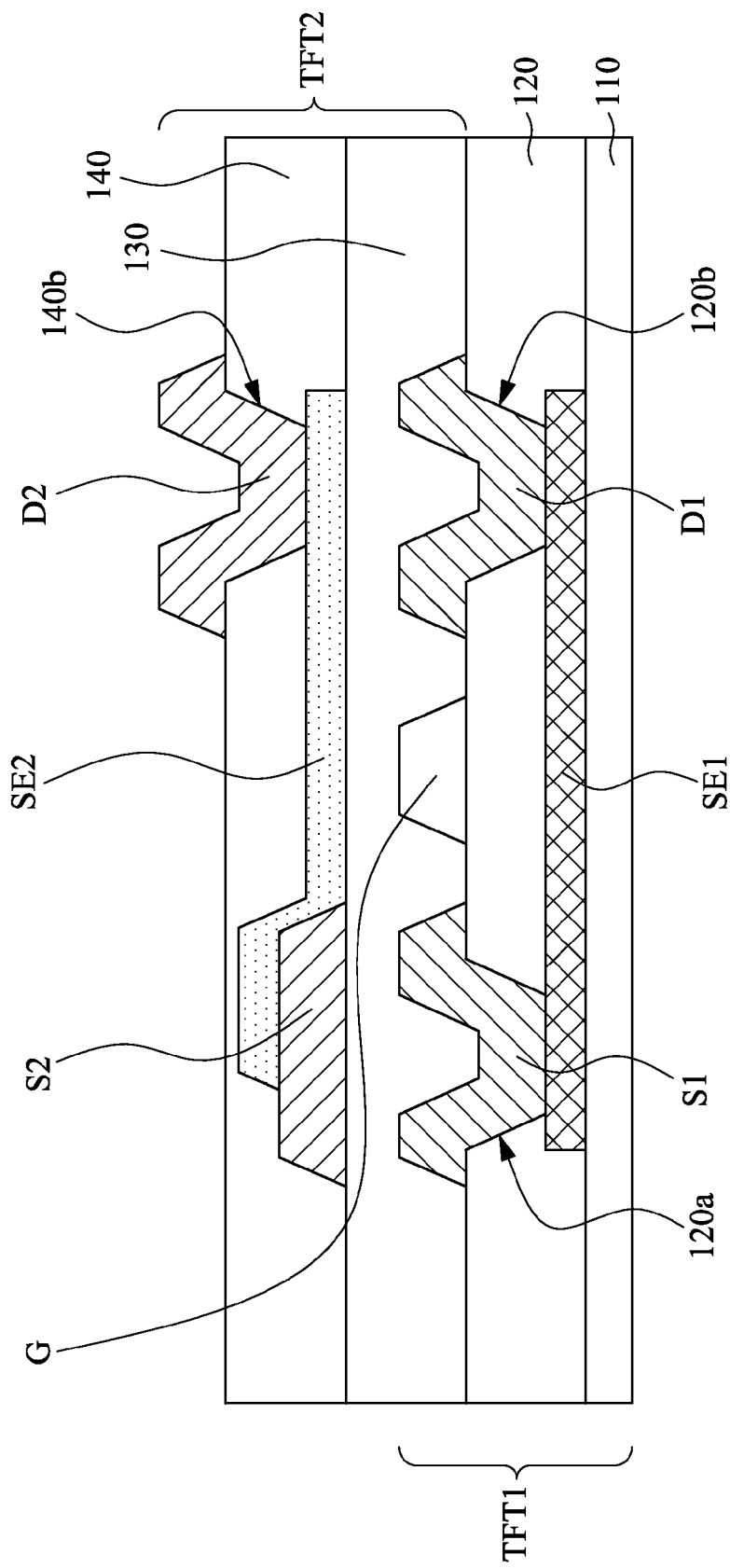
FIG. 3 is a cross-sectional view of a double thin film transistor according to further embodiment of the present invention.

FIG. 3 is a cross-sectional view of a double thin film transistor according to further embodiment of the present invention. The first thin film transistor TFT1 of the embodiment of FIG. 3 and that of FIG. 1 are the same, but the second thin film transistor TFT2 of the embodiment of FIG. 3 and that of FIG. 1 are different. As shown in FIG. 3, the second source S2 and the second drain D2 belong to different layers and formed by different processing steps. Specifically, the second source S2 is disposed over and in contact with the second insulating layer 130, and the second semiconductor layer SE2 is disposed over the second source S2 and directly in contact with a portion of the second source S2. The third insulating layer 140 is disposed over the second semiconductor layer SE2. The third insulating layer 140 has a fourth opening 140b, and the second semiconductor layer SE2 is in contact with a portion of the second drain D2 through the fourth opening 140b. It is noteworthy that the second source S2 and the second drain D2 of the embodiment are separately formed, such that a distance between the second source S2 and the second drain D2 is not limited to accuracy of an exposure process, and a channel length can be further shortened to achieve ultrahigh resolution.

Figure 4:
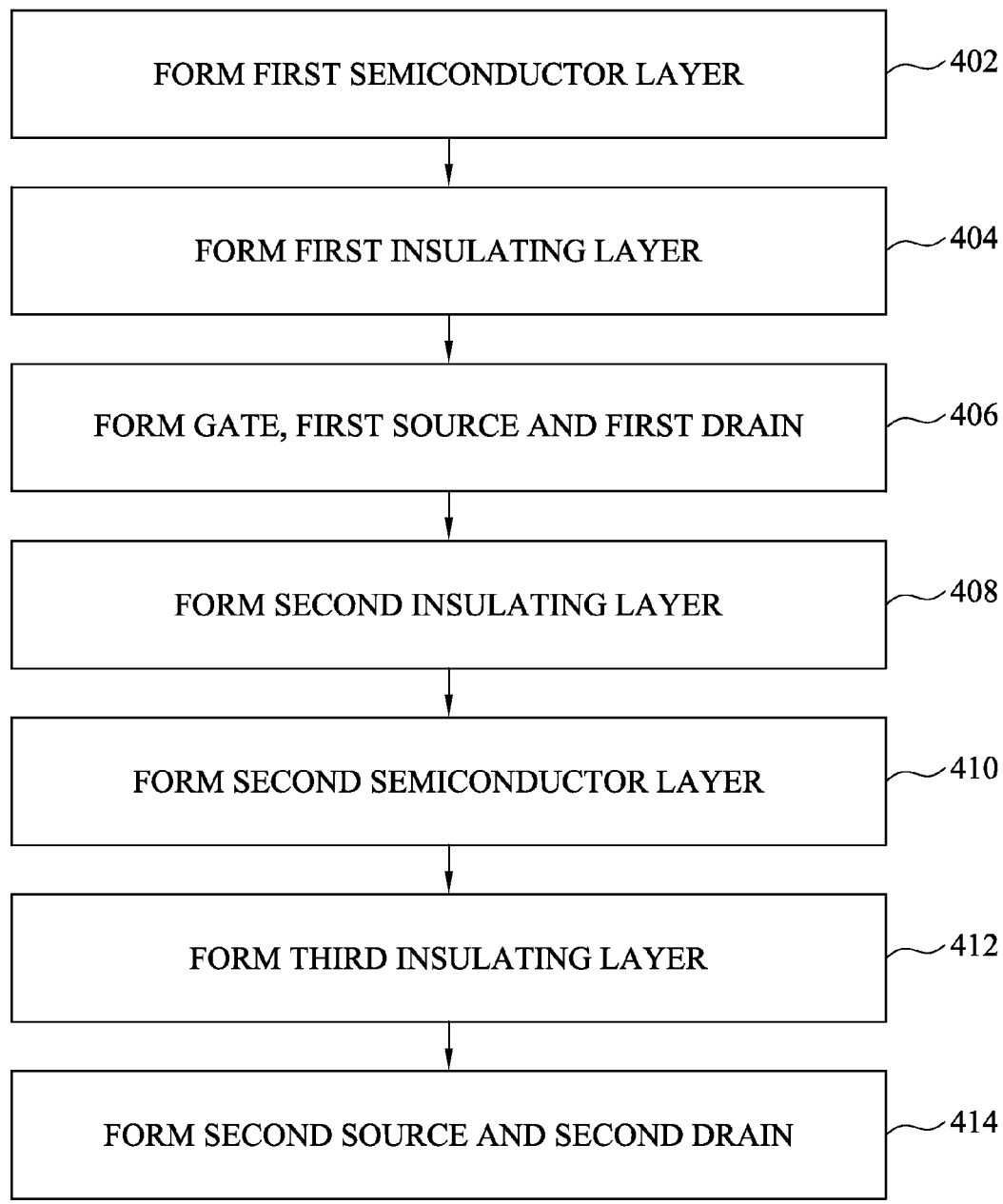
FIG. 4 is a flow chart schematically illustrating a method of manufacturing a thin film transistor substrate according to one embodiment of the present invention.

FIG. 4 is a flow chart schematically illustrating a method of manufacturing a thin film transistor substrate according to one embodiment of the present invention. A sequence of processing steps of FIG. 4 is collocated with the structure of FIG. 1. If the relative positional relationship between the elements is changed, the sequence of the processing steps of the manufacturing method will be changed. Therefore, the method of manufacturing the double thin film transistor of the present invention is not limited to the embodiments exemplified in the detailed description of the present invention.

Referring to FIGS. 4 and 1, in Step 402, a first semiconductor layer SE1 is formed over a substrate 110. A first semiconductor material layer (not shown) may be formed over the substrate 110 using sputtering, physical vapor deposition, chemical vapor deposition or other film deposition techniques, and a patterning process, such as a photolithography and etching process, is performed on the first semiconductor material layer to form the first semiconductor layer SE1.

In Step 404, a first insulating layer 120 is formed over the first semiconductor layer SE1. For example, a first insulating material layer (not shown) may be formed over the first semiconductor layer SE1 using sputtering, physical vapor deposition, chemical vapor deposition or other film deposition techniques, and a patterning process, such as a photolithography and etching process, is performed on the first insulating material layer to form the first insulating layer 120. After the patterning process is performed, a first opening 120a and a second opening 120b are formed in the first insulating layer 120 and separated from each other. The first opening 120a and the second opening 120b expose two portions of the first semiconductor layer SE1.

In Step 406, a gate G, a first source S1 and a first drain D1 are formed over the first insulating layer 120. The first semiconductor layer SE1 is in contact with a portion of the first source S1 and a portion of the first drain D1. For example, a conductive layer (not shown) may be formed over the first insulating layer 120 and in the first opening 120a and the second opening 120b using sputtering, physical vapor deposition, chemical vapor deposition or other film deposition techniques, and a patterning process, such as a photolithography and etching process, is performed on the conductive layer to form the gate G, the first source S1 and the first drain D1. The first semiconductor layer SE1 is in contact with a portion of the first source S1 and a portion of the first drain D1 respectively through the first opening 120a and the second opening 120b. When the etching process is performed, the first insulating layer 120 can be acted as an etch stop layer to prevent the first semiconductor layer SE1 from corrosion. In the embodiment, forming the gate G, forming the first source S1 and forming the first drain D1 are conducted by a same photolithography and etching process, but in other embodiments, the gate, the first source and the first drain may be formed separately.

In Step 408, a second insulating layer 130 is formed over the gate G. For example, the second insulating layer 130 may be formed over the gate G, the first source S1 and the first drain D1 using sputtering, physical vapor deposition, chemical vapor deposition or other film deposition techniques.

In Step 410, a second semiconductor layer SE2 is formed over the second insulating layer 130. For example, a second semiconductor material layer (not shown) may be formed over the second insulating layer 130 using sputtering, physical vapor deposition, chemical vapor deposition or other film deposition techniques, and a patterning process, such as a photolithography and etching process, is performed on the second semiconductor material layer to form the second semiconductor layer SE2.

After the second semiconductor layer SE2 is formed, in Step 412, a third insulating layer 140 is formed over the second semiconductor layer SE2. For example, a third insulating material layer (not shown) may be formed over the second semiconductor layer SE2 using sputtering, physical vapor deposition, chemical vapor deposition or other film deposition techniques, and a patterning process, such as a photolithography and etching process, is performed on the third insulating material layer to form the third insulating layer 140. After the patterning process is performed, a third opening 140a and a fourth opening 140b are formed in the third insulating layer 140 and separated from each other, and the third opening 140a and the fourth opening 140b expose two portions of the second semiconductor layer SE2.

In Step 414, a second source S2 is formed over the third insulating layer 140 and in the third opening 140a, and a second drain D2 is formed over the third insulating layer 140 and in the fourth opening 140b to let the second semiconductor layer SE2 in contact with a portion of the second source S2 and a portion of the second drain D2 respectively through the third opening 140a and the fourth opening 140b. For example, a conductive layer (not shown) may be formed over the third insulating layer 140 and in the third opening 140a and the fourth opening 140b using sputtering, physical vapor deposition, chemical vapor deposition or other film deposition techniques, and a patterning process, such as a photolithography and etching process, is performed on the conductive layer to form the second source S2 and the second drain D2. When the etching process is performed, the third insulating layer 140 can be acted as an etch stop layer to prevent the second semiconductor layer SE2 from corrosion.

Figure 5:
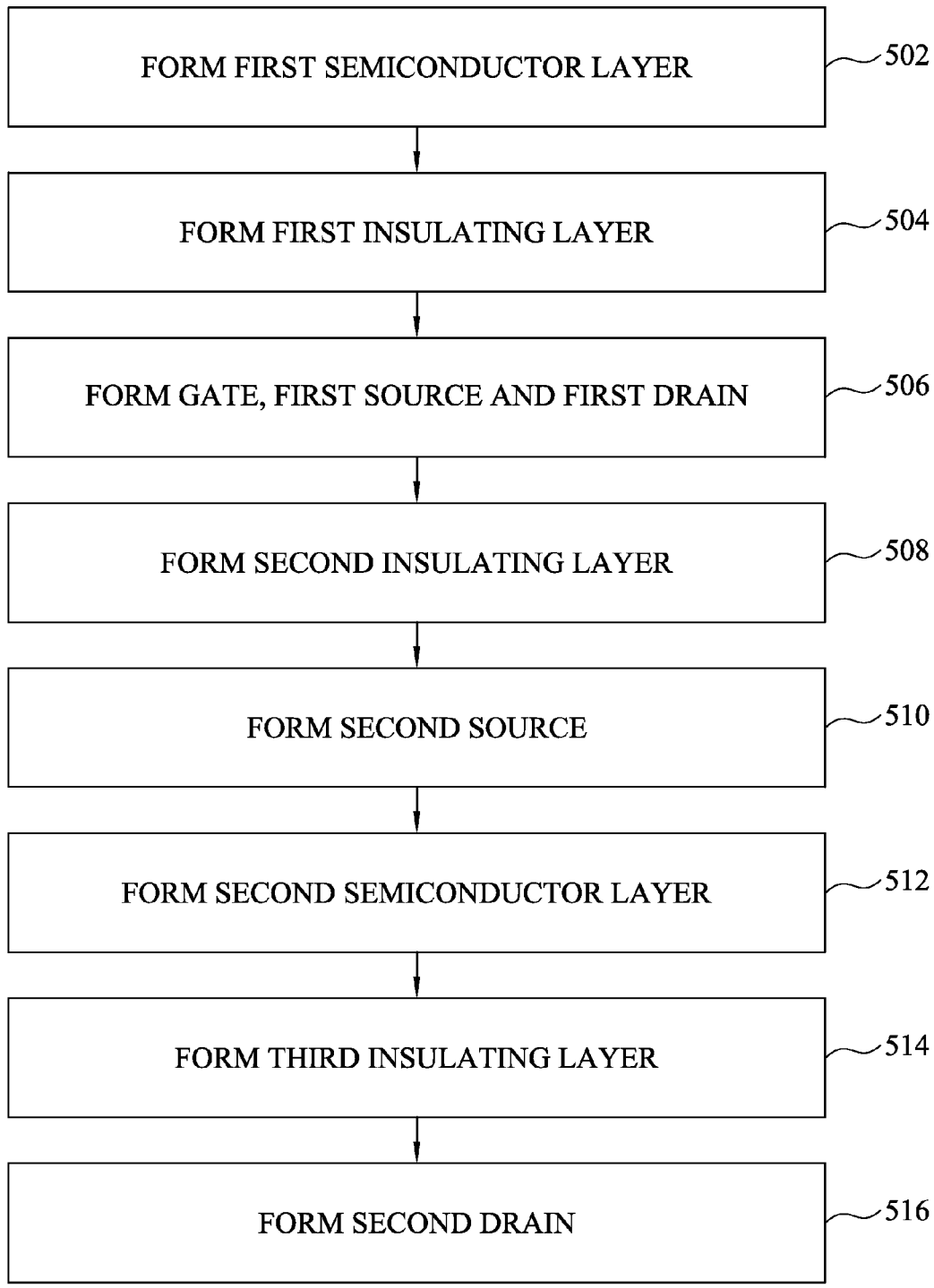
FIG. 5 is a flow chart schematically illustrating a method of manufacturing a thin film transistor substrate according to another embodiment of the present invention.

FIG. 5 is a flow chart schematically illustrating a method of manufacturing a thin film transistor substrate according to another embodiment of the present invention. A sequence of processing steps of FIG. 5 is collocated with the structure of FIG. 3. Since the first thin film transistor TFT1 of the embodiment of FIG. 3 is the same as that of FIG. 1, embodiments of Steps 502, 504, 506 and 508 of FIG. 5 may be respectively the same as those of Steps 402, 404, 406 and 408. However, the second thin film transistor TFT2 of the embodiment of FIG. 3 is different from that of FIG. 1, and thus the steps for forming elements included in the second thin film transistor TFT2 will be described below in detail.

Before a second semiconductor layer SE2 is formed, in Step 510, a second source S2 is formed over a second insulating layer 130. For example, a conductive layer (not shown) may be formed over a second insulating layer 130 using sputtering, physical vapor deposition, chemical vapor deposition or other film deposition techniques, and a patterning process is performed on the conductive layer to form the second source S2.

In Step 512, a second semiconductor layer SE2 is formed over the second insulating layer 130 and the second source S2. For example, a second semiconductor material layer (not shown) may be formed over the second insulating layer 130 and the second source S2 using sputtering, physical vapor deposition, chemical vapor deposition or other film deposition techniques, and a patterning process, such as a photolithography and etching process, is performed on the second semiconductor material layer to form the second semiconductor layer SE2.

After the second semiconductor layer SE2 is formed, in Step 514, a third insulating layer 140 is formed over the second semiconductor layer SE2 and the second source S2. For example, a third insulating material layer (not shown) may be formed over the second semiconductor layer SE2 and the second source S2 using sputtering, physical vapor deposition, chemical vapor deposition or other film deposition techniques, and a patterning process, such as a photolithography and etching process, is performed on the third insulating material layer to form the third insulating layer 140 over the second semiconductor layer SE2 and the second source S2. After the patterning process is performed, a fourth opening 140b is formed in the third insulating layer 140 and exposing a portion of the second semiconductor layer SE2.

In Step 516, a second drain D2 is formed over the third insulating layer 140 and in the fourth opening 140b to let the second semiconductor layer SE2 in contact with a portion of the second drain D2 through the fourth opening 140b. For example, a conductive layer (not shown) may be formed over the third insulating layer 140 and in the fourth opening 140b using sputtering, physical vapor deposition, chemical vapor deposition or other film deposition techniques, and a patterning process is then performed on the conductive layer to form the second drain D2. In particular, since the second source S2 and the second drain D2 are formed separately, a distance between the second source S2 and the second drain D2 is not limited to accuracy of an exposure process, and a channel length can be further shortened to achieve ultrahigh resolution.

Given the above, the method of the present invention may be used to manufacture the double thin film transistor including two thin film transistors stacked along a thickness direction and sharing a same gate. The double thin film transistor may be applied in circuit design including a plurality of thin film transistors, such as GIP circuit design, to decrease occupied area on the substrate, and thus to solve the problem mentioned in the related art.

It will be apparent to those ordinarily skilled in the art that various modifications and variations may be made to the structure of the present invention without departing from the scope or spirit of the invention. In view of the foregoing, it is intended that the present invention cover modifications and variations thereof provided they fall within the scope of the following claims.

What is claimed is:

1. A double thin film transistor, comprising:
    a first semiconductor layer disposed over a substrate;
    a first insulating layer disposed over the first semiconductor layer, wherein the first insulating layer has a first opening and a second opening separated from each other;
    a first source and a first drain respectively in the first opening and the second opening, and the first semiconductor layer in contact with a portion of the first source and a portion of the first drain respectively through the first opening and the second opening; and
    a gate laterally between the first source and the first drain, and the gate, the first source and the first drain belong to a same conductive layer;
    a second insulating layer over the gate, the first source and the first drain;
    a second semiconductor layer over the second insulating layer, wherein the first semiconductor layer and the second semiconductor layer are the same conductive type; and
    a second source and a second drain disposed over the second insulating layer, and the second semiconductor layer in contact with a portion of the second source and a portion of the second drain.

2. The double thin film transistor of claim 1, further comprising a third insulating layer disposed over the second semiconductor layer, and the third insulating layer has a third opening and a fourth opening separated from each other, and the second semiconductor layer is in contact with the portion of the second source and the portion of the second drain respectively through the third opening and the fourth opening.

3. The double thin film transistor of claim 1, wherein the second semiconductor layer is disposed over the second source and directly in contact with the portion of the second source.

4. The double thin film transistor of claim 3, further comprising a third insulating layer disposed over the second semiconductor layer, and the third insulating layer has a fourth opening, and the second semiconductor layer is in contact with the portion of the second drain through the fourth opening.

* * * * *